INVENTOR.
STANLEY GEWIRTZ
BY Samuel J. Stoll
ATTORNEY

INVENTOR.
STANLEY GEWIRTZ
BY
ATTORNEY

1

3,358,212
WIDE-BAND LINEAR AC-DC CONVERTER
Stanley Gewirtz, 435 W. 119th St., New York, N.Y. 10027
Filed May 16, 1966, Ser. No. 557,332
3 Claims. (Cl. 321—45)

This application is a continuation-in-part of my application Ser. No. 182,464, filed Mar. 26, 1962, now abandoned.

This invention relates to an AC-DC converter comprising two resistors and two dissimilar diodes and an integration capacitor, both diodes having extremely low junction capacitance, plus phase-switching speeds to enable them to be used over extraordinarily wide bands—the coodinates of the two diodes being chosen so that the coordinate of one cancels out the coordinate of the other, resulting in a linear coordinate; and the general object of the invention is to provide such a converter, in the form of a specially designed circuit embracing specially selected components.

The object of the circuit, and its advantages, are remarkably good linear AC to DC conversion, extremely small signal detectability, extremely wide-band frequency response, and operability at voltage levels such as those normally found in conversion circuits of up to two volts RMS, while using one diode having reverse-voltage characteristics on the order of ten volts, and another diode which is a backward tunnel diode having characteristics at the present state of the art requiring an absolute maximum internal dissipation of under nine hundred microwatts (900 mw.) and a maximum peak inverse voltage (PIV) of around four hundred sixteen millivolts (416 mv.) As is obvious, this last-named diode itself would be destroyed at two volts.

The circuit presently to be described causes this last diode to receive across it a maximum EMF of about three hundred thirty millivolts (330 mv.), which is equal to the forward voltage drop of a germanium switching diode operating in the "on" condition.

Other objects, features, and advantages of the invention will be more fully understood from the following description and the claims, and from the drawing, which is diagrammatic.

Figure 1:
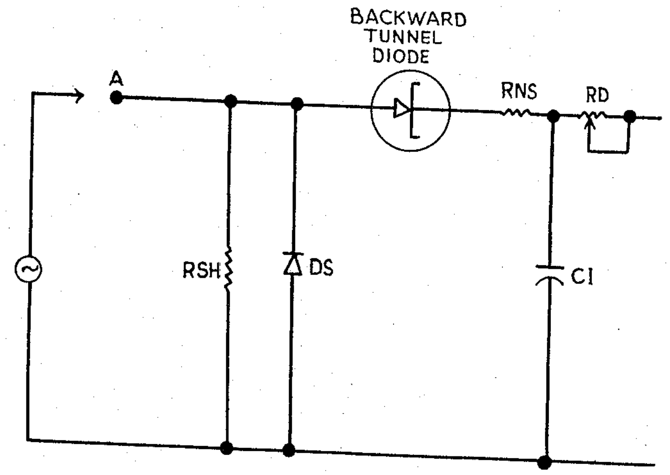
FIGURE 1 is a labeled and symbolic schematic diagram of the present converter circuit and of its components.

The converter circuit hereof and illustrated in the drawing, FIGURE 1 comprises terminal A for the presentation of a signal between that terminal and ground (symbol), terminal A being connected to a backward tunnel diode (labeled), and the latter through a divider resistor RNS to capacitor CI. In parallel between the leg connecting terminal A and the backward tunnel diode and ground are a diode DS—a germanium switch, adapted to operate in its blocking state when a positive signal is presented to terminal A—and a resistor RSH. Capacitor CI is connected to both resistor RNS and to ground.

When a positive signal is presented between terminal A and ground, the backward tunnel diode conducts through resistor RNS, presenting an immediate current to be integrated by capacitor CI. Resistor RNS is such as to have series resistive characteristics large enough to swamp out any residual negative resistance which may be generated by the backward tunnel diode. A complementary advantage of resistor RNS is to limit the current at which the backward tunnel diode would normally conduct at any specific voltage level, as well as to prevent the circuit from operating as a "peak" detecting type system. Inasmuch as the backard type diode possesses the property of effecting a tunneling current, it also possesses two particular advantages: one is that its maximum speed of operation is equal to the speed of light; and the other is that, inasmuch as tunneling occurs in the unit, conduction can be realized at the lowest millivolt levels, thus enabling the circuit to detect a signal such as would have heretofore required pre-amplification.

2

During a period of presentation of a positive signal to terminal A diode DS (see above) operates in its blocking state. Diode DS is a fast germanium switch with a typical capacitance of around one half of a micromicrofarad and a recovery time on the order of three nanoseconds. This is a limiting factor of the frequency response of this converter. Resistor RSH, in parallel with diode DS, is used for swamping out leakage and temperature-generated leakages which might appear as reverse leakages of diode DS. During the negative conduction state, when a negative signal is presented to terminal A, diode DS is in full conduction, causing the maximum reverse voltage required to be handled by the backward tunnel diode (see above) to be limited to .33 or .35 volt, which is the forward conduction due to the voltage drop of diode DS. This, of course, provides the advantages which would normally require a series of approximately eight backward tunnel diodes to achieve in the reverse direction, plus the advantages of the forward conduction of but a single backward tunnel diode.

The choice of diode for this converter relates to reasons of economy and reliability. With the appearance of the new half-nanosecond switching diodes which have recently come into existence, this circuit can be adapted for operation at frequencies as high as 13,000 megacycles.

It has been shown that this conversion circuit is unique in its applicability and versatility as it has at the same time the ability to achieve remarkably good linearity and extremely broad latitude in frequency response, high reliability, low manufacturing cost, and ease of assembly due to simplicity of design. As is well known, most AC converters of this general class have a stand-off voltage equivalent to the diode leakages—herein neutralized by the resistor RSH—which leakages require in the converters what is known as an AC balance network in vacuum tube voltmeter system. Here the AC balance network comprises a resistor voltage divider, one leg of it being a potentiometer, plus a high-resistance current-limiting arrangement used to buck out the leakage voltage of a diode, this voltage being caused by leakage currents. When a diode is backward-biased by reversed voltage presented to its forward direction, it cannot conduct until its forward voltage exceeds the bucking voltage. Commonly this accomplishes a zero stand-off voltage output of the converter. However, the presentation of a bucking voltage to the forward point of a diode results in causing the component to operate more as a switch than as a rectifier, which in turn further delinearizes the function of the circuit.

It will be observed that herein disclosed is a linearized wide band AC-DC converter circuit having two signal input terminals, two signal output terminals, a first resistor which is connected across the input terminals, a first diode which is connected across the input terminals in parallel with the first resistor, a second diode and a second resistor, which are connected in series circuit, one end of the series circuit being connected to one of the input terminals, a variable resistor being connected between one of the output terminals and the other end of said series circuit, the other input terminal and other output terminal being connected together on a common line, and an integration capacitor which is connected at one end to the common line and at its other end to the connection between the variable resistor and said other end of the series circuit, the diodes being of different types, having low junction capacitance and such coordinates that the coordinate of one diode cancels the coordinate of the other diode, whereby an AC signal applied at the input terminals results in a DC signal at the output terminals, the magnitude of the DC output signal being linearly related to the amplitude of the AC input signal at all frequencies of AC input signal and at all amplitudes of input signal. The first diode is disclosed as a germanium switching diode and the second diode as a backward tunnel diode. The first resistor has a high resistance for neutralizing signal leakage current and temperature generated leakage current appearing as reverse leakages of the first diode, and the second resistor has a high resistance to limit conduction current of the second diode to a safe limit and to compensate for residual negative resistance of the second diode.

Figure 2:
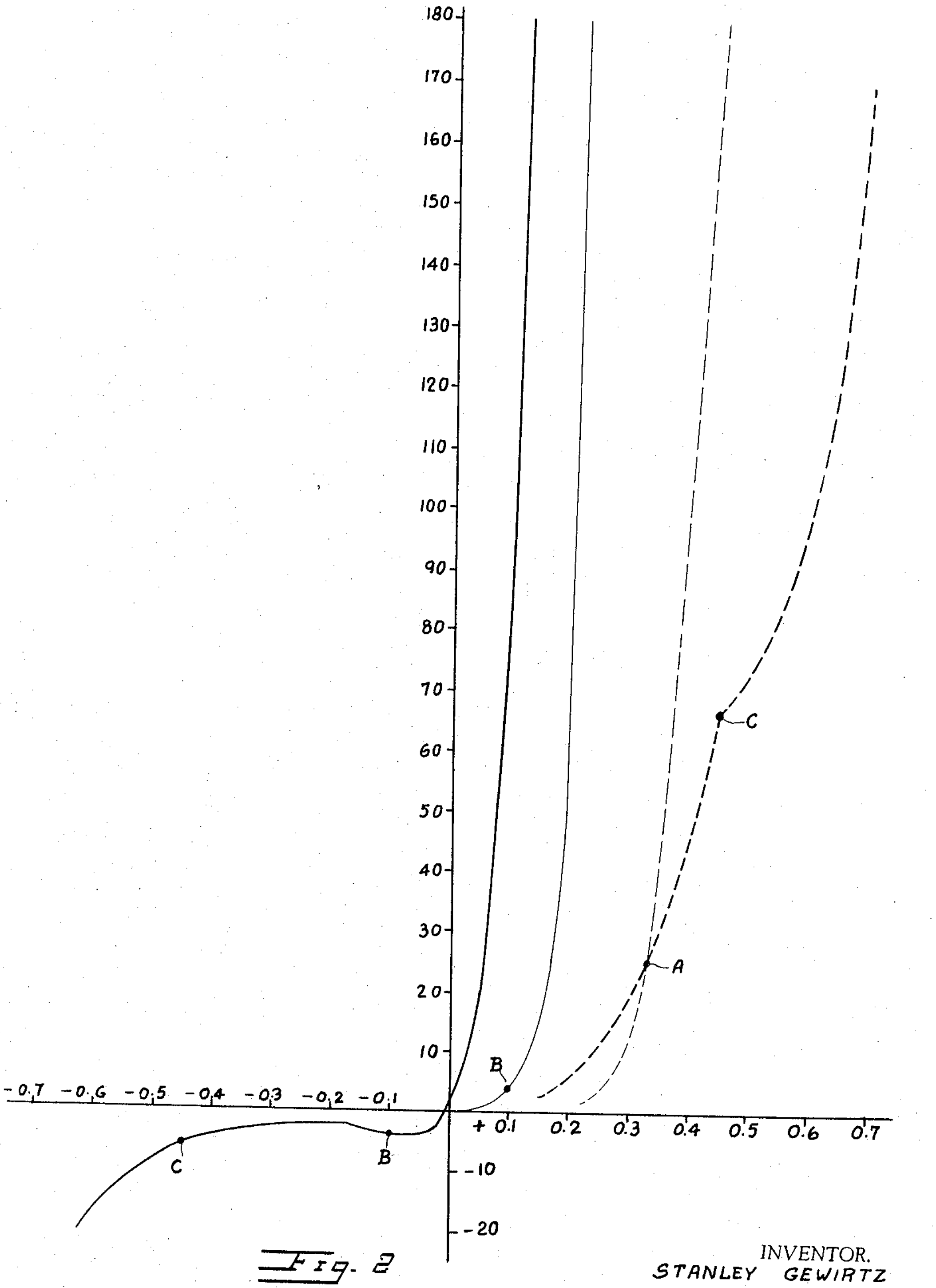
FIGURE 2 is a graphic plot of the characteristics of a backward tunnel diode and of an example of a commercially available diode which may be used as diode DS in the circuit diagram of FIGURE 1.

FIGURE 2 shows the characteristics of a backward tunnel diode and of commercially available diodes for use as diode DS and is intended to be illustrative. Point A on the graph is the point at which diode DS assumes its detection function. Points B are the points where diode DS removes error caused by the so-called peak point current of the backard tunnel diode in the reverse direction. Points C are indicative of the break-down region which are in fact never reached in the circuit shown in FIGURE 1 because, before such points are reached, diode DS is conducting. The backward tunnel diode characteristics illustrated are for the Hoffman Electronics Corporation type No. HU–8A. The diode DS characteristics are for a Hughes Aircraft Corporation type No. HD–1872C. The heavy traces are for the HU–8A and the light traces are for the HD–1872C. Solid traces are for abscissa values times $10^{-4}$ amperes and dashed traces are for abscissa values times $10^{-2}$ amperes. The ordinate values are volts.

The circuit herein disclosed eliminates the abovementioned complexities and their inherent disadvantages.

What is claimed is:

1. Apparatus and circuit in which the peak inverse voltage of a tunnel diode may be increased from its normal point to any peak voltage required, comprising: two signal input terminals, two signal output terminals, a first resistor, said first resistor having a high impedance and being connected across the input terminals, a rectifying diode connected across the input terminals in parallel with the first resistor, a backward tunnel diode and a second resistor connected in series circuit, one end of the series circuit being connected to one of the input terminals, a variable resistor being connected between one of the output terminals and the other end of said series circuit, the other input terminal and other output terminal being connected together on a common line, and an integration capacitor connected at one end to the common line and at its other end to the connection between the variable resistor and said other end of the series circuit.

2. A linearized wide band AC-DC converter circuit comprising in combination: two signal input terminals, two signal output terminals, a first resistor, said resistor having a high impedance and being connected across the input terminals, a rectifying diode connected across the input terminals, in parallel with the first resistor, a backward tunnel diode and a second resistor connected in series circuit, one end of the series circuit being connected to one of the input terminals, a variable resistor being connected between one of the output terminals and the other end of said series circuit, the other input terminal and other output terminal being connected together on a common line, and an integration capacitor connected at one end to the common line and at its other end to the connection between the variable resistor and said other end of the series circuit, the diodes being of different types, having low junction capacitances and such coodinates that the coordinate of one diode cancels the coodinate of the other diode, whereby an AC signal applied at the input terminals results in a DC signal at the output terminals, the magnitude of the DC output signal being linearly related to the amplitude of the AC input signal at all frequencies of AC input signal and at all amplitudes of input signal.

3. Apparatus and circuit in which the peak inverse voltage of a tunnel diode may be increased from its normal point to any peak voltage required in accordance with claim 1, wherein the circuit is a simple three-terminal network and wherein the tunnel diode and the backward tunnel diode have complementary dissimilar coordinates, said two coordinates being integrated in the capacitor to produce a linear coordinate.

References Cited

UNITED STATES PATENTS

| | | | |
|---|---|---|---|
| 2,985,836 | 5/1961 | Hatton | 307—88.5 |
| 3,119,072 | 1/1964 | Sommers | 307—88.5 |
| 3,141,125 | 7/1964 | Kurimura et al. | 321—46 |
| 3,153,151 | 10/1964 | Farnsworth | 307—88.5 |
| 3,179,813 | 4/1965 | Vernot et al. | 307—88.5 |
| 3,189,757 | 6/1965 | Feller | 307—88.5 |

JOHN F. COUCH, *Primary Examiner.*

M. L. WACHTELL, *Assistant Examiner.*